United States Patent
Chen et al.

(10) Patent No.: US 6,939,790 B2
(45) Date of Patent: *Sep. 6, 2005

(54) WAFER BUMPING PROCESS WITH SOLDER BALLS BONDED TO UNDER BUMP METALLURGY LAYER FORMED OVER ACTIVE SURFACE BY FORMING FLUX ON SOLDER BALL SURFACES AND REFLOWING THE SOLDER

(75) Inventors: Jau-Shoung Chen, Jubei (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 35 days.

This patent is subject to a terminal disclaimer.

(21) Appl. No.: 10/693,896

(22) Filed: Oct. 28, 2003

(65) Prior Publication Data

US 2004/0127010 A1 Jul. 1, 2004

(30) Foreign Application Priority Data

Dec. 25, 2002 (TW) .......................................... 91137392

(51) Int. Cl.⁷ ............................................ H01L 21/441
(52) U.S. Cl. ................. 438/614; 438/615; 257/E21.508
(58) Field of Search ................................ 438/108, 612, 438/613, 614, 615; 257/738, E21.508; 29/842; 228/180.22

(56) References Cited

U.S. PATENT DOCUMENTS

| | | | | |
|---|---|---|---|---|
| 6,695,200 B2 * | 2/2004 | Suzuki et al. | .......... | 228/180.22 |
| 6,723,629 B2 * | 4/2004 | Hotchkiss et al. | .......... | 438/612 |
| 2001/0000929 A1 * | 5/2001 | Gilleo | .......... | 257/795 |
| 2001/0025874 A1 * | 10/2001 | Nishiyama | .......... | 228/180.22 |
| 2002/0089067 A1 * | 7/2002 | Crane et al. | .......... | 257/778 |
| 2002/0170942 A1 * | 11/2002 | Hwee et al. | .......... | 228/180.22 |
| 2002/0173134 A1 * | 11/2002 | Viswanadam et al. | .......... | 438/613 |
| 2003/0164552 A1 | 9/2003 | Tong et al. | | |
| 2003/0189249 A1 | 10/2003 | Tong et al. | | |
| 2004/0127009 A1 * | 7/2004 | Chen et al. | .......... | 438/612 |

* cited by examiner

*Primary Examiner*—Stephen W. Smoot
(74) *Attorney, Agent, or Firm*—Bacon & Thomas, PLLC

(57) ABSTRACT

A bumping process, which is a method of forming a plurality of bumps over a wafer, is provided. The wafer has an active surface having a passivation layer and a plurality of bonding pads thereon. The passivation layer exposes the bonding pads on the active surface. An adhesion layer is formed over the active surface of the wafer covering both the bonding pads and the passivation layer. A metallic layer is formed over the adhesion layer. The adhesion layer and the metallic layer are patterned, so that the adhesion layer and the metallic layer remain on top of the bonding pads. A photoresist layer is formed on the active surface of the wafer. The photoresist layer has a plurality of openings that exposes the metallic layer. Next, solder balls with a solidified material on the surface of each solder ball are disposed into each opening. Then, a reflow process is carried out, so that the solder balls bond with the metallic layer. Finally, the photoresist layer is removed.

13 Claims, 5 Drawing Sheets

WAFER BUMPING PROCESS WITH SOLDER BALLS BONDED TO UNDER BUMP METALLURGY LAYER FORMED OVER ACTIVE SURFACE BY FORMING FLUX ON SOLDER BALL SURFACES AND REFLOWING THE SOLDER

BACKGROUND OF THE INVENTION

1. Field of Invention

This invention relates to a bumping process. More particularly, the present invention is related to a method of forming high-quality bumps for a high-density package.

2. Related Art

In this information explosion age, integrated circuit products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuit package. In a flip-chip package, the bonding pads on a die and the contacts on a substrate are connected together through a plurality of bumps. Hence, compared with a wire-bonding package or a tape automated bonding (TAB) package, a flip-chip package uses a shorter electrical path on average and has a better overall electrical performance. Moreover, the back surface of a flip-chip die may be exposed to the outside to increase the performance of the heat dissipation of said flip chip package. Due to the above and other reasons, flip-chip packages are produced in large volumes in the semiconductor industry.

FIG. 1 to FIG. 4 are partially enlarged cross-sectional views showing the progression of steps in a conventional method of forming a bump on the surface of a metallurgy layer 120 includes an adhesion layer and one or a stack of metallic layers, for example a barrier layer and a wetting layer. To form the under bump metallurgy layer 120, a sputtering process is first conducted to form an adhesion layer on the active surface 112 of the wafer 110. Next, a sputtering or plating process is conducted to form one or more metallic layers over the adhesion layer. Thereafter, photolithography and etching processes are used to pattern the under bump metallurgy layer 120 so that a residual portion of the under bump metallurgy layer 120 remains on top of the bonding pad 116.

As shown in FIG. 2, a spin-coating process is conducted to form a photoresist layer 130 over the active surface 112 of the wafer 110, wherein the photoresist layer 130 can be a dry film. Through photolithography and etching processes, a plurality of openings 132 (only one opening is shown) are formed in the photoresist layer 130. The openings 132 expose the under bump metallurgy layer 120. Next, as shown in FIG. 3, a flux material 160 is dispensed in the openings 132 and above the surface of the photoresist layer 130. Afterwards, a solder ball mounting process is performed to place the solder balls 140 in the openings 132 as shown in FIG. 3. Then a reflow process is performed to dispose the solder balls above the bonding pads 116 more securely as shown in FIG. 4, wherein the solder balls 140 are directly mounted onto the under bump metallurgy layers 120 and the flux material 160 flows on the surfaces of the solder balls 140 and vaporized. Thereafter, a liquid cleaner is applied to remove the residual flux material from the surface of the solder balls 140. Finally, the photoresist layer 130 is removed from the active surface 112 of the wafer 110 as shown in FIG. 4 so that a bump 150 is produced. Therein, the bump 150 actually comprise the solder ball 140 and the under bump metallurgy layer 120.

In the aforementioned fabrication process, the solder ball 140 is disposed into the openings 132 of the photoresist layer 130 by a solder ball placer. However, the flux material 160 is easily flowed into the solder ball placer so as to contaminate said solder ball placer. In addition, the flux material 160 will enhance the connection between the solder balls so as to lower the performance and operation efficiency of said solder ball placer.

Therefore, providing another method for forming bumps to solve the mentioned-above disadvantages is the most important task in this invention.

SUMMARY OF THE INVENTION

In view of the above-mentioned problems, an objective of this invention is to provide a method of forming bumps, and more particularly, a method of forming high-quality bumps inside a high-density package.

To achieve these and other advantages and in accordance with the purpose of the invention, as embodied and broadly described herein, the invention provides a method of forming a plurality of bumps over a silicon wafer. The wafer has an active surface having a passivation layer and a plurality of bonding pads formed thereon. The passivation layer exposes the bonding pads on the active surface. To form the bumps, an under bump metallurgy layer is formed over the active surface of the wafer covering both the bonding pads and the passivation layer. Next, the under bump metallurgy layer are patterned so that a residual portion of the under bump metallurgy layer remains on top of the bonding pads. Thereafter, a photoresist layer is formed on the active surface of the wafer. The photoresist layer has a plurality of openings that exposes the residual portion of the under bump metallurgy layer. Then, a plurality of solder balls are provided to dispose in the openings of the photoresist layers by a solder balls placer, wherein each solder ball has a solid-like flux material or a solid flux material on the surface of said solder ball. Afterwards, a reflow process is carried out so that the solder balls will connect to the residual portion of the under bump metallurgy layer. Finally, the flux material is cleared and the photoresist layer is removed.

According to one preferred embodiment of this invention, the material constituting the under bump metallurgy layer includes aluminum, titanium, titanium-tungsten alloy, chromium, chromium-copper alloy, copper or tantalum. In addition, the material constituting the under bump metallurgy layer includes nickel-vanadium alloy, titanium nitride compound, tantalum nitride compound, nickel, chromium-copper alloy, chromium, copper, palladium or gold. The material constituting the solder ball includes lead-tin alloy or lead-free alloy, and the lead-free alloy includes tin, gold, copper, magnesium, bismuth, antimony, indium, zinc or an alloy made up from any combination of the elements in the above list. Moreover, the material constituting the bonding pad includes copper or aluminum.

As mentioned above, the surface of each solder ball has a solid-like flux material or a solid flux material. Accordingly, when the solder balls are disposed in the openings, it will not cause the flux material contaminate the solder ball placer. Moreover said flux material can not make the solder balls connect with each other more securely. Thus it cannot lower the operation efficiency of the solder ball placer.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
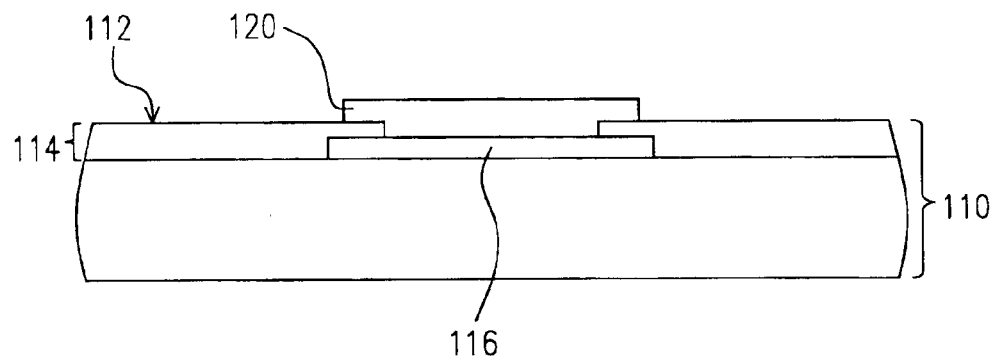
FIGS. 1 to 4 are partially enlarged cross-sectional views showing the progression of steps in a conventional method of forming a bump on the surface of a chip.
Figure 2:
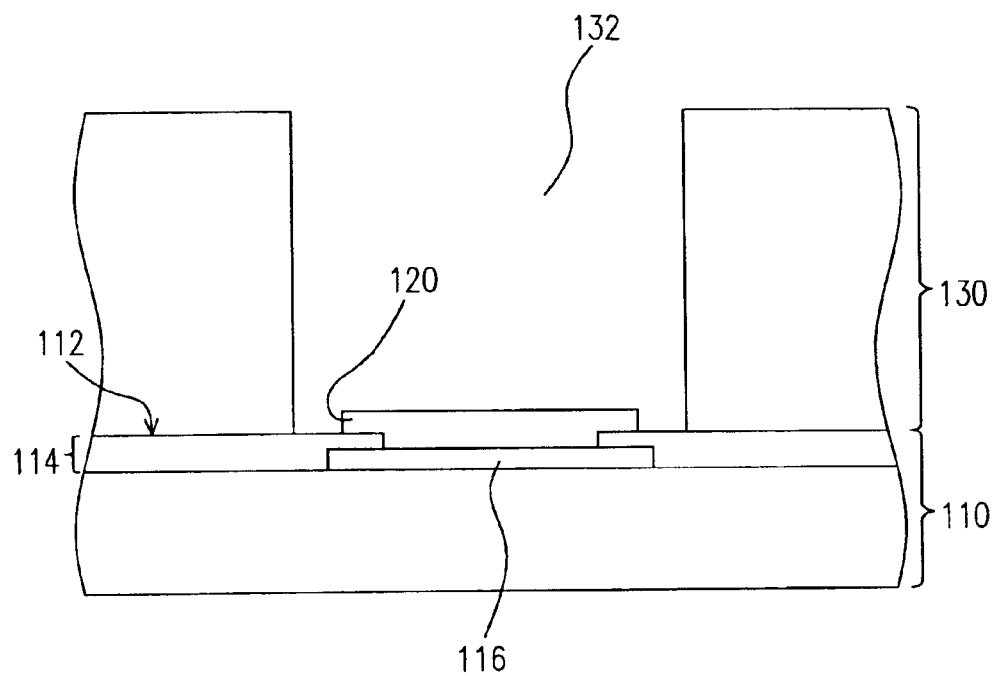
Figure 3:
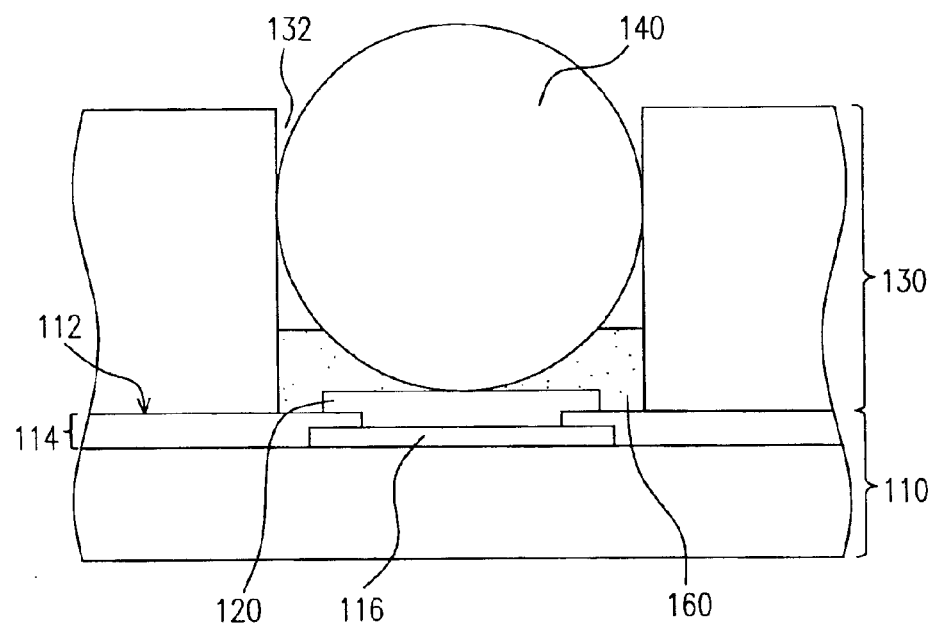
Figure 4:
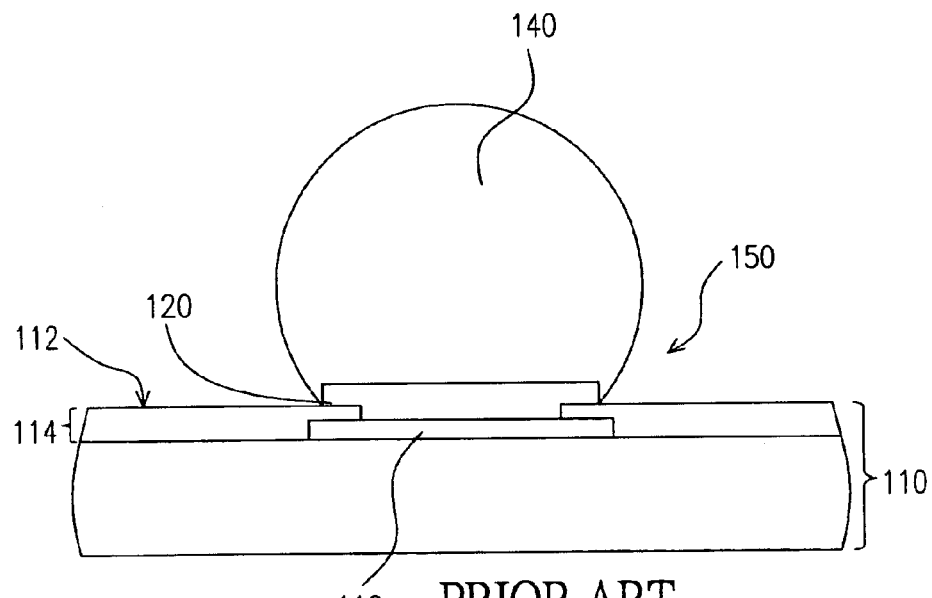

The method of forming bumps according to the preferred embodiment of this invention will be described herein below with reference to the accompanying drawings, wherein the same reference numbers are used in the drawings and the description to refer to the same or like parts.

FIGS. 5 to 9 are partially enlarged cross-sectional views showing the progression of steps for forming a bump on the surface of a chip according to one preferred embodiment of this invention.

Figure 5:
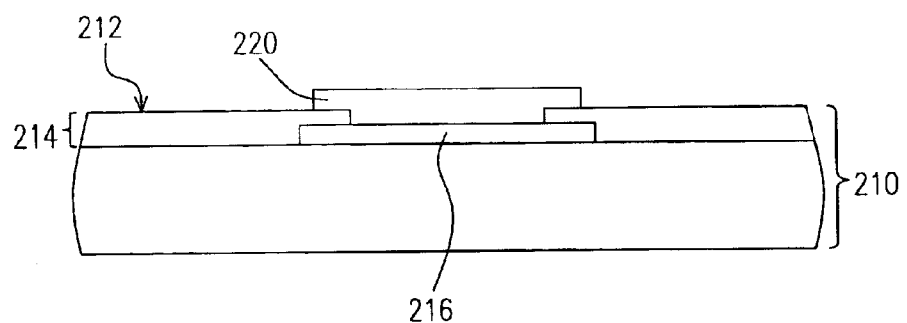
FIGS. 5 to 9 are partially enlarged cross-sectional views showing the progression of steps for forming a bump on the surface of a chip according to the preferred embodiment of this invention.

As shown in FIG. 5, a silicon wafer 210 having an active surface 212 thereon is provided. The active surface 212 of the wafer 210 further includes a passivation layer 214 and a plurality of bonding pads 216 (only one is shown). The passivation layer 214 exposes the bonding pads 216. The bonding pads 216 are aluminum or copper pads, for example. A process to form an under bump metallurgy layer 220 over the bonding pad 216 is performed. First, an adhesion layer is formed over the active surface 212 of the wafer 210 by sputtering. Thereafter, one or more metallic layers are formed over the adhesion surface by sputtering or electroplating. Hence, the under bump metallurgy layer 220 has a structure that includes a single adhesion layer and a single or a stack of metallic layers, such as a barrier layer or a wetting layer. Photolithography and etching processes are carried out to pattern the under bump metallurgy layer 220 so that only a residual portion of the under bump metallurgy layer 220 remains on the top of the bonding pads 216. The adhesion layer is made from a material including, for example, aluminum, titanium, titanium-tungsten alloy, chromium, chromium-copper alloy, copper or tantalum. The metallic layer is made from a material including nickel-vanadium alloy, titanium nitride compound, tantalum nitride compound, nickel, chromium-copper alloy, chromium, copper, palladium or gold. Details of their structures can be found in U.S. Pat. App. No. 20030189249 and 20030164552.

Figure 6:
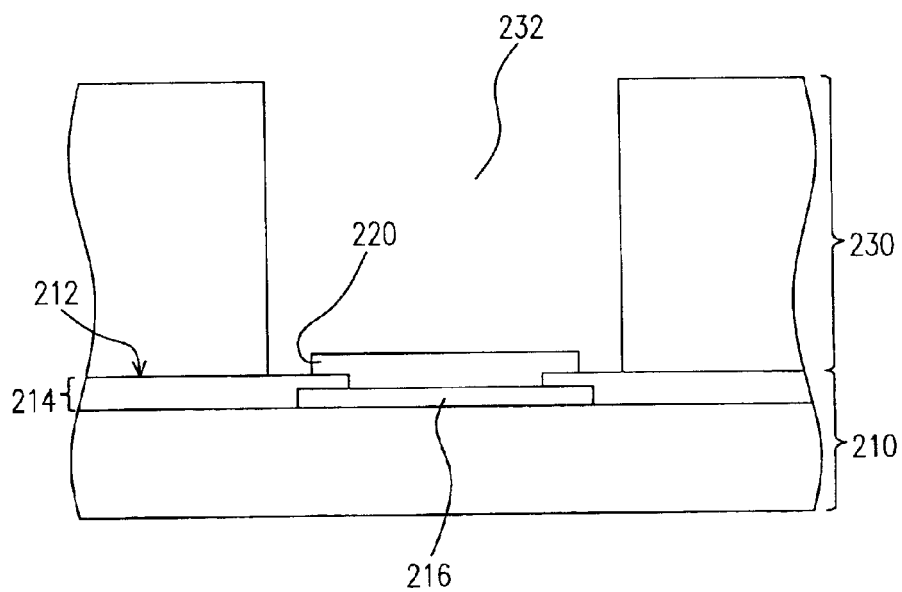

Afterwards, a polymer layer 230, for example a photoresist layer and a dry film, is provided over the active surface 212 of the wafer 210 as shown in FIG. 6. Therein, a spin-coating process is performed to form a photoresist layer 230 over the active surface 212 of the wafer 210 and the dry film is directly attached on the active surface 212 of the wafer 210. Next, a photolithography and etching process are carried out to form a plurality of openings 232 (only one opening is shown) in the polymer layer 230. The openings 232 expose the under bump metallurgy layer 220.

Figure 7:
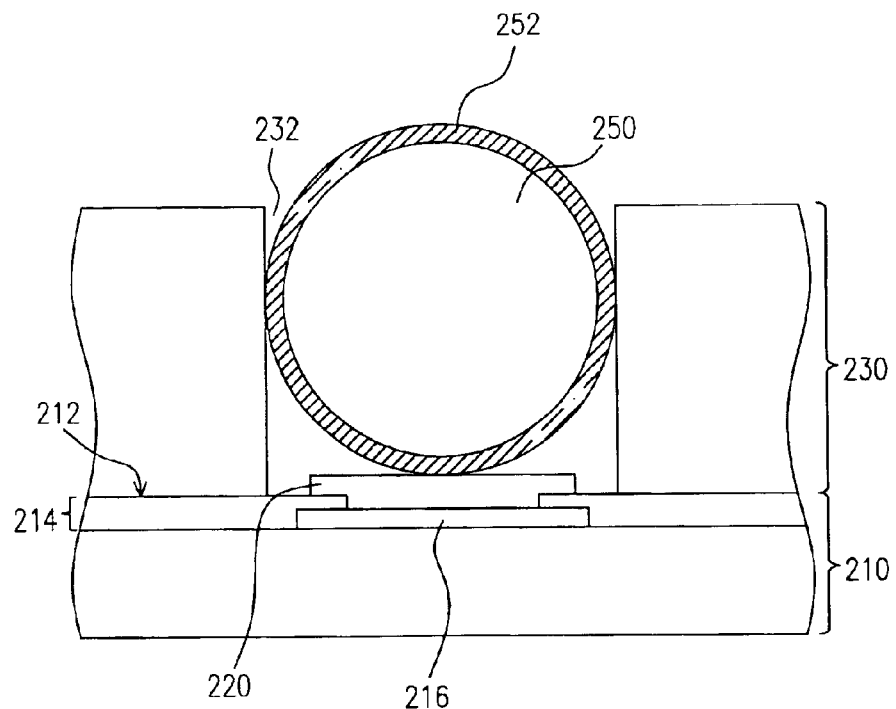

As mentioned above, there is further provided solder balls 250 with a solid-like or solid flux material 252 formed on the surfaces and said solder balls 250 are disposed in the openings 232 by the solder ball placer (not shown) as shown in FIG. 7. Therein, the solder balls 250 can be in the form of exact balls or ball-like shape, and the solder balls 250 are made from a material including lead-tin alloy, tin, gold or other lead-free alloys. The lead-free solder balls 250 are mainly binary, tertiary, quaternary alloy consisting of some of the following metals: tin, gold, silver, copper, magnesium, bismuth, antimony, indium and zinc. Since the metals can be combined in different proportions, there are virtually countless types of lead-free blocks. In general, each type of lead-free solder ball has a unique set of physical and electrical properties.

The material constituting the solder balls may include a lead-tin alloy. More particularly, the material constituting the solder balls is selected from the group consisting of lead, gold, silver, copper, magnesium, bismuth, antimony, indium and zinc. This obviously includes mixtures of these materials.

Figure 8:
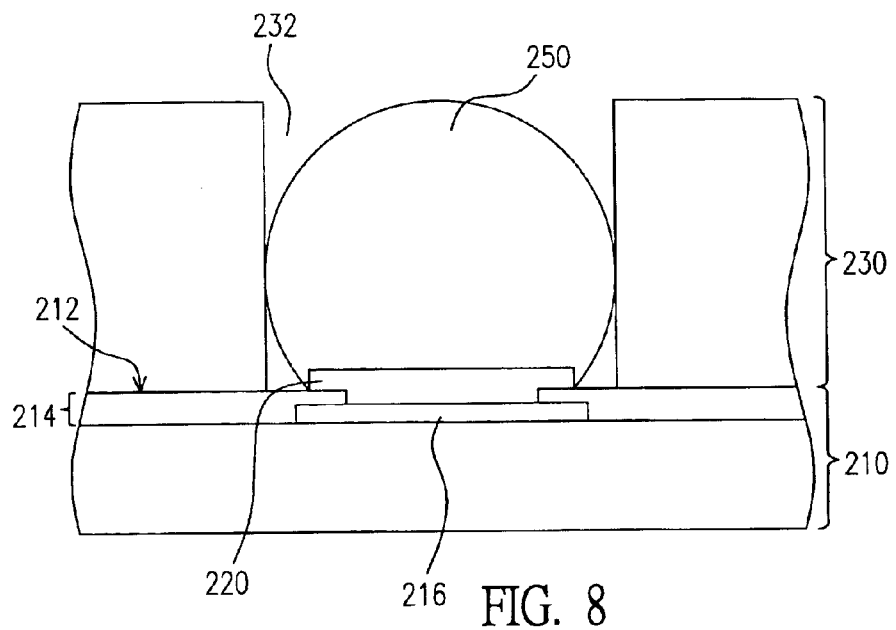
Figure 9:
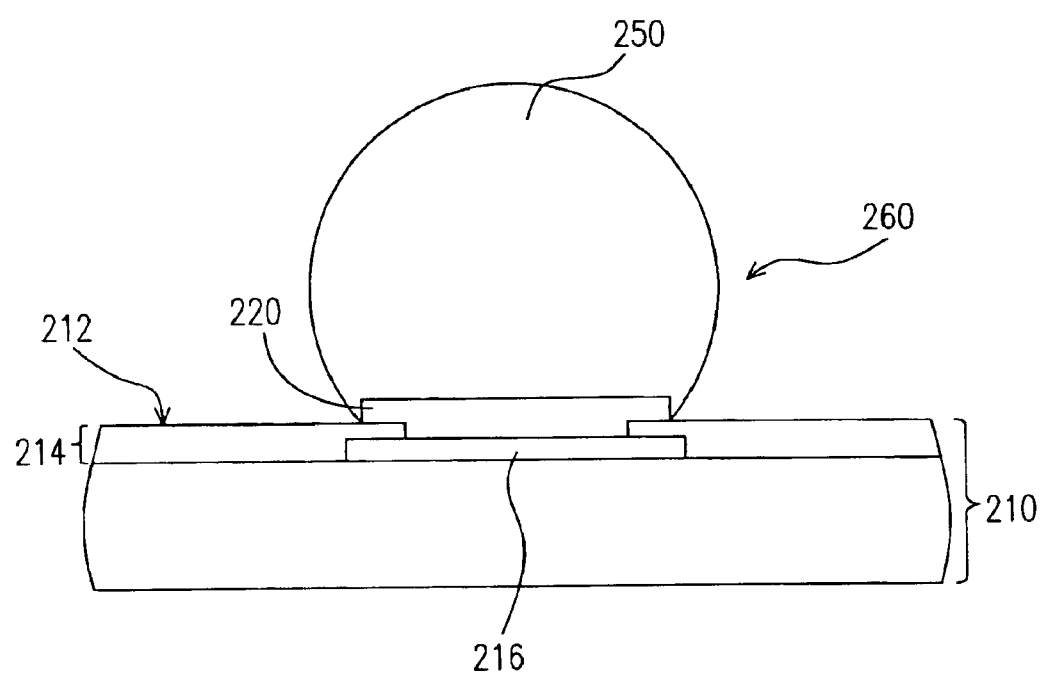

Then, through the flux material 252 on the surface of said solder ball 250, the lower portion of the solder ball 250 melts in a reflow process so that the solder ball 250 and the under bump metallurgy layer 220 are bonded together as shown in FIG. 8. In the reflow process, foaming gas, for example nitrogen gas or hydrogen gas, can be filled in the reflow chamber so as to make the oxygen gas to activate with hydrogen gas or to lower the capability of the oxygen gas for activating by the nitrogen gas. Thus the surfaces of the solder balls 250 can be prevented from oxidation. Next, a liquid cleaning agent is used to remove the residual flux material 240 from the surface of the solder balls 250. Finally, the polymer layer 230 is removed from the active surface 212 of the wafer 210 and the process for forming bumps 260 is completed as shown in FIG. 9. Thus, the bump 260 is a composite structure comprising the solder ball 250 and the under bump metallurgy layer 220.

In the aforementioned process, the solder balls have a solid-like or solid material formed on the surfaces of the solder balls. Thus when the solder balls are disposed in the openings of the polymer layers, the flux material will not contaminate the solder ball placer. Moreover, said solid-like flux material and said solid flux material will not make the solder balls connecting and joining with each other, so the operation efficiency of the solder ball placer will be upgraded.

Although the invention has been described in considerable detail with reference to certain preferred embodiments, it will be appreciated and understood that various changes and modifications may be made without departing from the spirit and scope of the invention as defined in the appended claims.

What is claimed is:

1. A method of forming a plurality of bumps on a wafer having an active surface, wherein the wafer further includes a plurality of bonding pads formed on the active surface and a passivation layer formed on the active surface that exposes the bonding pads, the method comprising the steps of:

forming an under bump metallurgy layer over the active surface of the wafer, wherein the under bump metallurgy layer covers both the bonding pads and the passivation layer;

patterning the under bump metallurgy layer so that a residual portion of the under bump metallurgy layer remains over each of the bonding pads;

forming a polymer layer over the active surface of the wafer, wherein the polymer layer has a plurality of openings that expose the residual portion of the under bump metallurgy layer;

disposing a plurality of solder balls into each of the openings, wherein each of the solder balls has a flux material formed on a surface of each of the solder balls;

performing a reflow process so that the solder balls are bonded to the residual portion of the under bump metallurgy layer; and removing the polymer layer.

2. The method of claim 1, wherein the under bump metallurgy layer comprises an adhesive layer and a metallic layer formed on the adhesive layer.

3. The method of claim 2, wherein a material constituting the adhesive layer is selected from a group consisting of titanium, titanium-tungsten alloy, chromium, chromium-copper alloy, copper and tantalum.

4. The method of claim 2, wherein a material constituting the metallic layer is selected from a group consisting of nickel-vanadium alloy, titanium nitride, tantalum nitride, nickel, chromium-copper alloy, chromium, copper and palladium.

5. The method of claim 2, wherein a material constituting the solder balls includes a lead-tin alloy.

6. The method of claim 2, wherein a material constituting the solder balls includes a lead-free alloy.

7. The method of claim 2, wherein a material constituting the solder balls is selected from a group consisting of lead, gold, silver, copper, magnesium, bismuth, antimony, indium and zinc.

8. The method of claim 1, wherein a material constituting the bonding pads is selected from a group consisting of copper and aluminum.

9. The method of claim 1, wherein the polymer layer is a photoresist layer.

10. The method of claim 1, wherein the polymer layer is a dry film.

11. The method of claim 1, wherein the polymer layer is formed by spin-coating.

12. The method of claim 1, wherein the flux material is solid-like.

13. The method of claim 1, wherein the flux material is in a solid state.

* * * * *